(12) United States Patent
Deymier et al.

(10) Patent No.: US 11,032,011 B2
(45) Date of Patent: Jun. 8, 2021

(54) SYSTEMS AND METHODS FOR A QUANTUM-ANALOGUE COMPUTER

(71) Applicant: Arizona Board of Regents on Behalf of the University of Arizona, Tucson, AZ (US)

(72) Inventors: Pierre A. Deymier, Tucson, AZ (US); Keith A. Runge, Tucson, AZ (US)

(73) Assignee: Arizona Board of Regents on Behalf of the University of Arizona, Tucson, AZ (US)

(*) Notice: Subject to any disclaimer, the term of this patent is extended or adjusted under 35 U.S.C. 154(b) by 0 days.

(21) Appl. No.: 16/500,958

(22) PCT Filed: Apr. 6, 2018

(86) PCT No.: PCT/US2018/026554
§ 371 (c)(1),
(2) Date: Oct. 4, 2019

(87) PCT Pub. No.: WO2018/187742
PCT Pub. Date: Oct. 11, 2018

(65) Prior Publication Data
US 2020/0036450 A1 Jan. 30, 2020

Related U.S. Application Data

(60) Provisional application No. 62/482,316, filed on Apr. 6, 2017.

(51) Int. Cl.
*H04B 10/70* (2013.01)
*B06B 1/06* (2006.01)
(Continued)

(52) U.S. Cl.
CPC .......... *H04B 10/70* (2013.01); *B06B 1/0688* (2013.01); *G01H 11/08* (2013.01); *G02B 6/1225* (2013.01);
(Continued)

(58) Field of Classification Search
CPC ....... H04B 10/70; H01L 49/006; H01L 33/06; H01L 29/0673; H01L 29/84;
(Continued)

(56) References Cited

U.S. PATENT DOCUMENTS 4,041,536 A * 8/1977 Melcher .................. H04N 3/10
348/198
4,091,681 A * 5/1978 Hordvik ............. G01N 21/1702
356/432
(Continued)

OTHER PUBLICATIONS

International Search Report and Written Opinion issued in corresponding Application No. PCT/US2018/026552 dated Jul. 2, 2018, 6 pages.
(Continued)

*Primary Examiner* — Bitew A Dinke
(74) *Attorney, Agent, or Firm* — Polsinelli PC

(57) ABSTRACT

Disclosed are systems and methods for a quantum-analogue computing bit array consisting of a single qubit analogue, a serial two qubit analogue coupling, or parallel N qubit analogues. The quantum-analogue computing bit array comprises an elastic media having photo-elastic and photo-expansion effects, the adjustment of which allows a manipulation of one or more structural degrees of freedom within the elastic media and one or more temporal degrees of freedom within the elastic media. At least one analogue qubit is defined by one or more elastic waves within the elastic media. The quantum-analogue computing bit array further comprises a modulated light source oriented to
(Continued)

illuminate the elastic media with a laser radiation to achieve a non-separable multi-phonon superposition of states within the elastic media.

15 Claims, 4 Drawing Sheets

(51) Int. Cl.

| | | |
|---|---|---|
| *G01H 11/08* | (2006.01) | |
| *G02B 6/122* | (2006.01) | |
| *H01L 29/06* | (2006.01) | |
| *H01L 33/06* | (2010.01) | |
| *H01L 49/00* | (2006.01) | |

(52) U.S. Cl.
 CPC .......... *H01L 29/0673* (2013.01); *H01L 33/06* (2013.01); *H01L 49/006* (2013.01)

(58) Field of Classification Search
 CPC ........ H01L 2224/75347; G02B 6/1225; G01H 11/08; B82Y 20/00; B82Y 10/00; G10K 15/04; B06B 1/0611; B06B 1/0688; H01H 2215/052; H01H 71/127; H01C 10/103
 See application file for complete search history.

(56) References Cited

U.S. PATENT DOCUMENTS

| | | | | |
|---|---|---|---|---|
| 4,122,495 A * | 10/1978 | Defranould | ............... | H04N 3/10 310/313 B |
| 4,524,294 A * | 6/1985 | Brody | ..................... | H01L 41/08 310/311 |
| 4,685,772 A * | 8/1987 | Chang | ..................... | G02F 1/116 359/287 |
| 6,311,004 B1 * | 10/2001 | Kenney | ............... | G02B 6/12026 385/130 |
| 8,525,619 B1 * | 9/2013 | Olsson | ............... | H03H 9/02228 333/187 |
| 2006/0272419 A1 * | 12/2006 | Maris | ................... | A61B 5/0097 73/606 |
| 2008/0270042 A1 * | 10/2008 | Wu | ...................... | G01N 21/658 702/28 |
| 2009/0231686 A1 * | 9/2009 | Atkins | .................. | G02F 1/0353 359/341.3 |
| 2010/0033710 A1 * | 2/2010 | Yacoubian | ......... | G01N 21/1702 356/72 |
| 2010/0246045 A1 * | 9/2010 | Shibata | .................. | B82Y 10/00 360/55 |
| 2012/0212375 A1 * | 8/2012 | Depree, IV | ............ | B82Y 10/00 343/700 MS |
| 2012/0217399 A1 * | 8/2012 | Yacoubian | ................ | G01J 5/38 250/338.1 |
| 2013/0278356 A1 * | 10/2013 | Meltaus | .................. | H03H 9/564 333/187 |
| 2014/0242329 A1 * | 8/2014 | Banaei | .................... | B29C 55/02 428/131 |
| 2014/0294024 A1 * | 10/2014 | Kim | ....................... | B82Y 20/00 372/20 |
| 2014/0326902 A1 | 11/2014 | Tahan | | |
| 2015/0022781 A1 | 1/2015 | Riken | | |
| 2015/0249111 A1 * | 9/2015 | Kang | ................. | G11C 13/0002 710/308 |
| 2016/0099701 A1 * | 4/2016 | Rinaldi | ..................... | G01J 5/20 422/90 |
| 2016/0182008 A1 * | 6/2016 | Bhattacharjee | .......... | H03H 9/25 310/313 B |
| 2016/0271427 A1 * | 9/2016 | Lal | ........................... | A61N 7/00 |
| 2017/0117848 A1 * | 4/2017 | Nomura | ................... | H03B 5/30 |
| 2017/0200841 A1 * | 7/2017 | Yoshikawa | ........ | H01L 31/03046 |
| 2017/0338282 A1 * | 11/2017 | Meotto | ............... | H01L 27/2472 |
| 2018/0287587 A1 * | 10/2018 | Campanella Pineda | ..................... | H03H 3/02 |

OTHER PUBLICATIONS

Roszak, et al., Photon-induced Dephasing of Singlet-triplet Superpositions in Double Quantum Dots Without Spin-orbit Coupling, Physical Review B, vol. 80, No. 19, Nov. 3, 2019. [online] https://arxiv.org/pdf/0903.0783.pdf.

Farrow, et al., Classification of Macroscopic Quantum Effects, Optics Communications, 337, 22-26, Feb. 15, 2015. [online] https://arxiv.org/pdf/1406.0659.df.

Chirolli, et al., Decoherence in Solid State Qubits, Advances in Physics, vol. 57, No. 3, May 1, 2018. [online] https://arxiv.org/pdf/0809.4716.pdf.

Deymier, et al., Torsional topology and fermion-like behavior of elastic waves in phononic structures, Comptes Rendus de l'Academie des Sciences—Mécanique 343, 700 (2015).

Arvind, et al., A two-qubit algorithm involving quantum entanglement, arXiv:quant-ph/0006069.

Bennett, et al., Quantum information and computation, Nature 404, 247 (2000).

Bruns, et al., Nanosecond switching in GeTe phase change memory cells, Appl. Phys. Lett. 95, 043108 (2009).

Conseil, et al., Te-based chalcohalide glasses for far-infrared optical fiber, Opt. Mater. Express 2, 1470 (2012).

Deutsch, et al., Rapid solutions of problems by quantum computation, Proceedings of the Royal Society of London A 439, 553 (1992).

Deymier, et al., One-Dimensional Mass-Spring Chains Supporting Elastic Waves with Non-Conventional Topology, Crystals 6, 44 (2016).

Deymier, et al., Rotational modes in a phononic crystal with fermion-like behavior, J. Appl. Phys. 115, 163510 (2014).

Deymier, et al., Torsional topology and fermion-like behavior of elastic waves in phononic structures, Comptes Rendus de l'Academie des Sciences—Mécanique 343, 700-711 (2015).

El-Kady, Phonon-based scalable quantum computing and sensing, Proc. SPIE 9436, Smart Sensor Phenomena, Technology, Networks, and Systems Integration 2015, 94360O (May 13, 2015); doi: 10.1117/12.2175914.

Gueguen, et al., Photoinduced fluidity in chalcogenide glasses at low and high intensities: A model accounting for photon efficiency, Phys. Rev. B: Condens. Matter 82, 134114 (2010).

Gump, et al., Light-Induced Giant Softening of Network Glasses Observed near the Mean-Field Rigidity Transition, Phys. Rev. Lett. 92, 245501 (2004).

Gustafsson, et al., Propagating phonons coupled to an artificial atom, Science 346, 207 (2014).

Hisakuni, et al., Giant photoexpansion in As2S3 glass, Appl. Phys. Lett. 65, 2925 (1994).

Hisakuni, et al., Optical microfabrication of chalcogenide glasses, Science 270, 974 (1995).

Interagency Working Group on Quantum Information Science of the Subcommittee on Physical Sciences, Advancing Quantum Information Science: National Challenges and Opportunities, Joint Report of the Committee on Science and Committee on Homeland and National Security of the National Science and Technology Council, Jul. 2016; www.whitehouse.gov/sites/whitehouse.gov/files/images/Quantum_Info_Sci_Report_2016_07_22%20final.pdf.

Khan, et al., Tailoring between network rigidity and nanosecond transient absorption in a-GexAs35-xSe65 thin films, Opt. Lett. 40, 768 (2015).

Khan, et al., Tuning nanosecond transient absorption in a-Ge25As10Se65 thin films via background illumination, Opt Lett 40, 4512 (2015).

Lencer, et al., A map for phase-change materials, Nat. Mater. 7, 972 (2008).

Loke, et al., Breaking the Speed Limits of Phase-Change Memory, Science 336, 1566 (2012).

Lucas, et al., Chalcogenide glass fibers: Optical window tailoring and suitability for bio-chemical sensing, Opt. Mater. (Amsterdam, Neth.) 47, 530-536, (2015).

Lyeo, et al., Thermal conductivity of phase-change material Ge2Sb2Te5, Appl. Phys. Lett. 89, 151904 (2006).

(56) References Cited

OTHER PUBLICATIONS

Maurugeon, et al., Selenium modified GeTe4 based glasses optical fibers for far-infrared sensing, Opt. Mat. 33, 660 (2011).
Maurugeon, et al., Telluride glass step index fiber for the far infrared, J. Lightwave Tech. 28, 3358 (2010).
Nazeer, et al., Young's modulus and residual stress of GeSbTe phase-change thin films, Thin Solid Films 592, 69 (2015).
Njoroge, et al., Density changes upon crystallization of Ge2Sb2.04Te4.74 films, J. Vac. Sci. Technol., A 20, 230 (2002).
Ruskov, et al., Coherent phonons as a new element of quantum computing and devices, Journal of Physics: Conference Series 398, 012011 (2012).
Ruskov, et al., On-chip cavity quantum phonodynamics with an acceptor qubit in silicon, Phys, Rev. B 88, 064308 (2013).
Shimizu, et al., Thickness and refractive-index changes associated with photodarkening in evaporated As2S3 films, J. Appl. Phys. 47, 2969 (1976).
Soliman, et al., Phononic crystals operating in the gigahertz range with extremely wide band gaps, Appl. Phys. Lett. 97, 193502 (2010).
Su, et al., Realization of a phononic crystal operating at gigahertz frequencies, Appl. Phys. Lett. 96, 053111 (2010).
Swinteck, et al., Bulk elastic waves with unidirectional backscattering-immune topological states in a time-dependent superlattice, J. Applied Phys. 118, 063103 (2015).
Tanaka, et al., Giant photo-expansion in chalcogenide glass. J. Optoelectron. Adv. Mater. 8, 2058 (2006).
Tanaka, Reversible photoinduced change in intermolecular distance in amorphous arsenic(III) sulfide network, Appl. Phys. Lett. 26, 243 (1975).
Tanaka, Transient-grating study of amorphous arsenic sulfide (As2S3) films, J. Appl. Phys. 65, 2042 (1989).
Uchino, et al., Mechanism of Photoinduced Changes in the Structure and Optical Properties of Amorphous As2S3, Phys. Rev. Lett. 85, 3305-3308 (2000).
Wang, et al., Fast phase transitions induced by picosecond electrical pulses on phase change memory cells, Appl. Phys. Lett. 93, 043121 (2008).
Wang, et al., Micromechanical Resonators Based on Silicon Two-Dimensional Phononic Crystals of Square Lattice, J. Microelectromech. Syst. 21, 801 (2012).
Wang, et al., Numerical and experimental study on silicon microresonators based on phononic crystal slabs with reduced central-hole radii, J. Micromech. Microeng. 23, 065030 (2013).
Wuttig, et al., Phase-change materials for rewriteable data storage, Nat. Mater. 6, 824 (2007).
Yang, et al., Long-wave infrared-transmitting optical fibers, J. Am. Ceram. Soc. 94, 1761-1765 (2011).
Yang, et al., Single-mode low-loss optical fibers for long-wave infrared transmission, Opt. Lett. 35, 3360-3362. (2010).
Zanardi, et al., Quantum Tensor Product Structures are observable induced, Phys. Rev. Lett. 92, 060402 (2004).
Zanardi, Virtual quantum systems, Phys. Rev. Lett. 87, 077901 (2001).

* cited by examiner

US 11,032,011 B2

SYSTEMS AND METHODS FOR A QUANTUM-ANALOGUE COMPUTER

FIELD

The present disclosure generally relates to a quantum-analogue computer, and in particular relates to systems and methods for a quantum-analogue computer having a single quantum-analogue bit operating system, a serial two quantum-analogue bit system with controllable coupling, and a coupled N quantum-analogue bit array.

BACKGROUND

Quantum information science exploits quantum-mechanical phenomena to perform computing operations. Quantum bit ("qubit") based computing platforms capitalize on the phenomenon of superposition. Because of superposition, a quantum computer can simultaneously process a number of calculations beyond that which can be achieved with conventional transistor-based processors. Superposition is essentially the ability of a system to be in multiple states that is, instead of encoding information in the form of a '0' or a '1' in conventional computers, a qubit can store and process a '0' or a '1' at the same time. When qubits are entangled, the state of an array of N qubits cannot be separated into a tensor product of states of individual qubits. With entangled states, one can achieve quantum exponential complexity. Entangled states of an N qubit system can simultaneously store and process $2^N$ bits of information, a colossal number as N becomes large. However, two quantum-computing barriers must be broken for quantum computers to achieve their promise by: (1) making qubits stable on macro timescales without necessitating cryogenic temperature to prevent decoherence of the states; and (2) making qubits numerous at the scale of massively parallel processing (also without decoherence of the states).

Current qubit platforms use a variety of quantum systems ranging from nuclear/electron spin, trapped ions, superconducting states, to photon polarization. Phonon-based qubits can be created by entangling a phonon with the spin states of a single atom embedded into a resonant mechanical cavity. These phonon-based devices manipulate quantum information as it transfers from phonon to matter, and vice versa; however, their conventional qubits are still encumbered with the major challenge of maintaining qubit coherence. As such, current qubit platforms are based on quantum particles that easily lose their superposition of states in a noisy environment, or in large arrays by decoherence.

It is with these observations in mind, among others, that various aspects of the present disclosure were conceived and developed.

BRIEF DESCRIPTION OF THE DRAWINGS

The application file contains at least one drawing executed in color. Copies of this patent application publication with color drawing(s) will be provided by the Office upon request and payment of the necessary fee.

Corresponding reference characters indicate corresponding elements among the view of the drawings. The headings used in the figures do not limit the scope of the claims.

DETAILED DESCRIPTION

Figure 1:
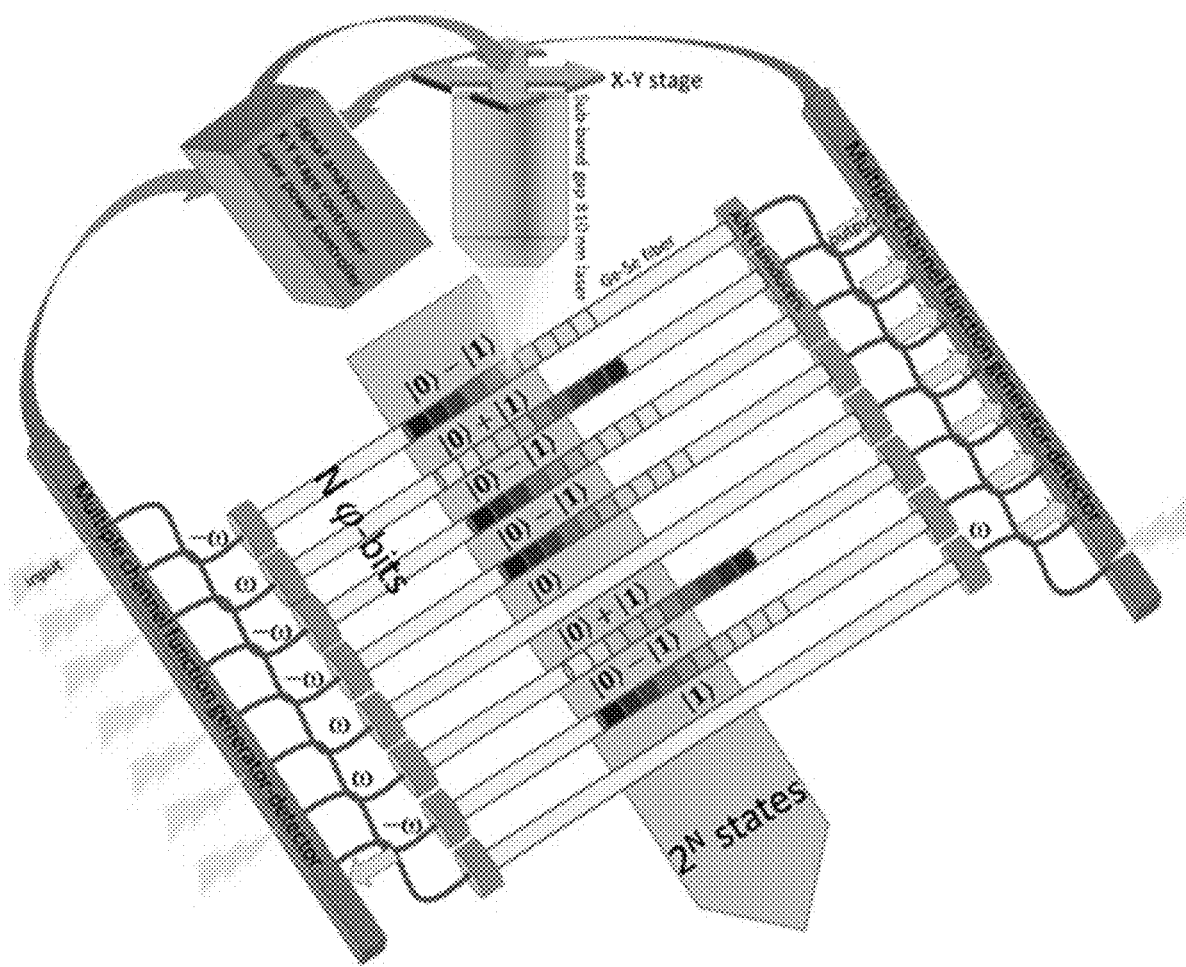
FIG. 1 is a schematic illustration of a N φ-bit parallel array, according to one aspect of the present disclosure.
Figure 2:
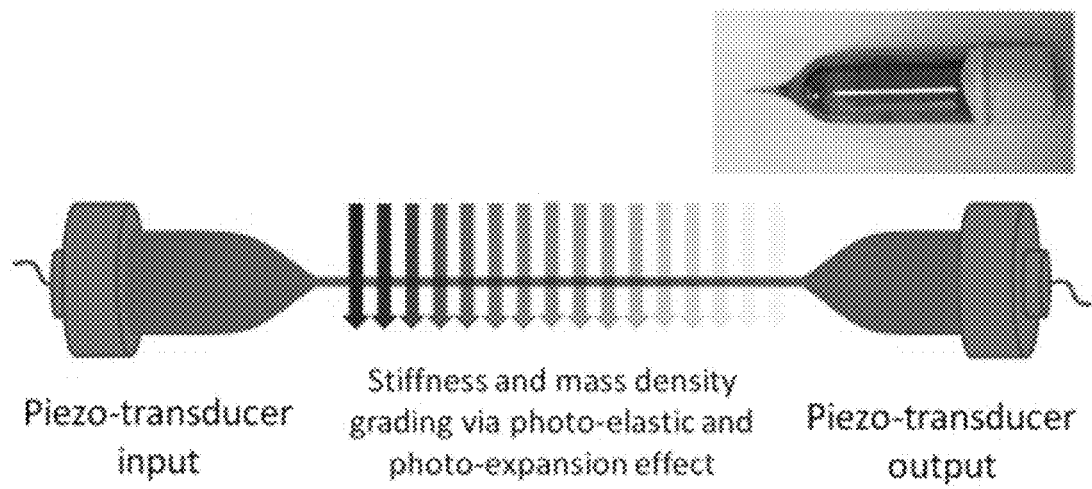
FIG. 2 is a simplified illustration showing an experimental set-up illustrating a single φ-bit by guiding a longitudinal elastic wave in a tapered and graded chalcogenide fiber, according to one aspect of the present disclosure.
Figure 3:
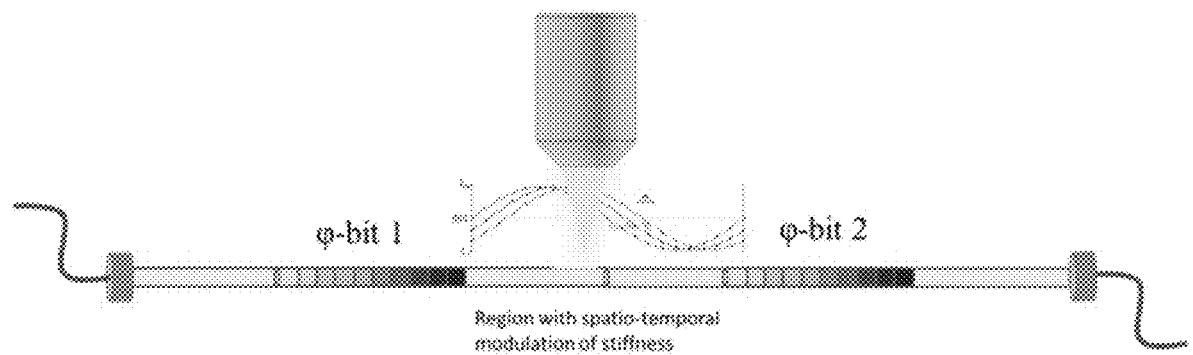
FIG. 3 is a schematic illustration showing a schematic set-up illustrating a serial two φ-bit chalcogenide fiber with bit-to-bit coupling controllable via spatio (sinusoidal)—temporal modulation of stiffness, according to one aspect of the present disclosure.

Using certain types of one-dimensional waveguides, elastic waves can be created to have spin-like characteristics related to their direction of propagation. These certain types of waveguides include, but are not limited to, one-dimensional harmonic crystals with masses attached to a rigid substrate, and elastic waveguides with graded properties. Properties of these elastic waves can be used as quantum spin analogues and are referred to as 'pseudospins'. Waves with broken symmetry, and therefore non-conventional topology, which are distributed between different 'internal' degrees of freedom or microscopic states (such as polarization, direction of propagation, sublattices, or layers) serve as pseudospins. Unlike electron spin, pseudospin is not associated with any intrinsic property of particles; rather it arises from the substructure in space (e.g., sublattices) and time in which the wave exists. The state of a pseudospin is observable and measurable (without the wave function collapse of quantum mechanics). As disclosed herein, it is contemplated that one or more transmission coefficient measurements can provide the necessary information to determine the superposition of states in terms of forward propagating and backward propagating components of a wave. Pseudospins can be prepared in superposition of states without suffering from quantum decoherence; they are nearly coherent in the elastic regime. As such, it is further contemplated that an elastic pseudospin can serve as a perfect qubit analogue, which is referred to herein as a 'phase bit' or a 'φ-bit'.

In addition, the inventors have also focused on the developments, fabrication, and experimental demonstration that arrays of ambient temperature elastic wave φ-bits to achieve a paradigm shift in quantum information processing. The elastic pseudospin superposition of states formed by φ-bits can be stable and decoherence free, measurable without wave function collapse, and non-separable/entangled. With these properties, the experimental realization of φ-bits offers a transformative new solution to reach the goal of quantum computing using materials-based quantum analogues. By building from a single φ-bit, to a serial two φ-bit with controllable coupling, and ultimately a coupled array of N φ-bit, the quantum-analogue computer of the present invention can physically create for the first time each fundamental component in all phonon-based quantum analogue computing platforms.

As noted previously, two quantum-computing barriers must be broken for quantum computers to achieve their promise by: (1) making qubits stable on macro timescales; and (2) making qubits numerous at the scale of massively parallel processing, while still avoiding quantum decoherence, i.e. the loss of quantum coherence. In quantum mechanics, particles such as electrons behave like waves and can be described by wave functions. Multiple waves can interfere, leading to peculiar behavior and other quantum phenomena. As long as there is a definite phase relation between different states, a system is said to be coherent. This coherence is a fundamental property of quantum mechanics, and is necessary for the function of quantum computers. However, when a quantum system is not perfectly isolated, or is otherwise in contact with its surrounding environment, its coherence will decay with time, causing the quantum behavior to be lost. This is quantum decoherence.

Elastic waves can be prepared in an exponentially complex superposition without suffering from the quantum decoherence and state collapse that are both experienced by true quantum particles. In the context of the present disclosure, superposition at the level of a single φ-bit is essentially the ability to be in multiple states—that is one φ-bit can store and process a '0' and a '1' at the same time. Accordingly, φ-bits can permit massively parallel processing of phonons. For example, an array of N=50 φ-bits has a parallel computing capacity of $2^{50}$ or $\sim 1 \times 10^{15}$ bits.

Disclosed herein are systems and methods for creating elastic wave supporting materials for forming stable (decoherence free), measurable (without wave function collapse), and controllable elastic pseudospin superposition of states, also referred to as a φ-bit. It is possible to form a superposition of pseudospin states that is non-separable, i.e., cannot be factored into the tensor product of individual pseudospin states, thus achieving the very desirable characteristic of quantum-like exponential complexity (also known as entanglement). In positive contrast to existing quantum systems, these non-separable elastic states of the present disclosure are measurable in a single measurement. This forms the foundation for a quantum-analogue computer: the physical and experimental realization of φ-bits based quantum analogue computing platforms.

Referring to the drawings, embodiments of a quantum-analogue computer platform are illustrated and generally indicated as 100 in FIGS. 1-7. The objective of the quantum-analogue computer platform 100 is to capitalize on the phenomenon of superposition that allows a quantum computer to simultaneously process calculations beyond what is achievable with conventional transistor-based processors. In some embodiments, the quantum analogue computing platforms 100 comprise arrays of φ-bits to display computing performances equivalent to those of quantum computers. In some embodiments, these quantum-analogue computer platforms 100 may include a single φ-bit, a serial two φ-bit with controllable coupling, and a coupled N φ-bit array.

All Phonon Qubit Analogues and their Scalable Arrays that can Perform Phonon-Based Quantum Computing Elastic Pseudospin:

Disclosed herein are systems and methods for forming stable (decoherence free), measurable (without wave function collapse), and controllable elastic pseudospin superpositions of states, which can offer a transformative new solution for quantum information processing using materials-based quantum analogues. Elastic waves with conical Dirac dispersion possess a half-integer spin analogue, aka the 'pseudospin'. Unlike electron spin, pseudospin is not associated with any intrinsic property of particles; rather it arises from the nature of the supporting medium in which the wave exists. Most importantly, elastic waves can maintain coherence over long periods exceeding seconds. Hence, elastic pseudospin states are ensemble properties; observable, measurable, and preparable in superposition without suffering from the quantum decoherence and state collapse of true quantum particles. The result is an elastic pseudospin that can serve as a perfect qubit analogue, which is referred to herein as a φ-bit.

Gated Control:

In elastic wave-supporting media subjected to external spatio-temporal stiffness modulation, the phase of the modulation can be used to control the evolution of the superposition of states of a φ-bit.

Non-Separable Superposition of Multiple Pseudospin States:

Since each waveguide possesses two directional degrees of freedom, the elastic states of an N-waveguide system can be represented in the $2^N$-dimensional tensor product Hilbert space of N 2D spinor subspaces associated with the individual waveguides. The elastic modes in this representation obey a $2^N$-dimensional non-linear Dirac-like equation. These modes span the same space as that of uncoupled waveguides grounded to a rigid substrate, i.e. N φ-bits. However, the modes' solutions of the nonlinear Dirac equation cannot be expressed as tensor products of the states of N uncoupled grounded waveguides i.e., φ-bit states.

Use of Photo Actuated Chalcogenide Fibers as a Supporting Elastic Medium for Single, Serial, and Parallel Qubit Arrays.

To develop φ-bits, materials solutions are implemented that can support and control pseudospins and their superposition for phonons through: (1) the intrinsic spatial (e.g., structural) degrees of freedom (DOF), such as graded elastic properties or elastic coupling; and (2) the temporal DOF that is defined by the ability of a material to undergo extrinsic dynamic modulation of its elastic properties. To realize the full computational potential of φ-bits, the challenge is to exploit the concepts of elastic pseudospin and solve the problem of coupling multiple qubit analogues (i.e., φ-bits) in an intrinsic, non-separable, and exponential way. The present disclosure contemplates the use of spatially and dynamically modulated Ge—As—Se chalcogenide materials. These elastic media possess the necessary formability and photo-elastic and photo-expansion effects to manipulate the structural DOF needed to achieve robust pseudospin φ-bits. They possess the requisite large, fast, and reversible photo-elastic response to form a quantum bit analogue through dynamic modulations. The processability of chalcogenide materials, and their ability to conform into device structures, makes them ideal for fabricating fiber φ-bits, followed by scalable arrays of elastically coupled φ-bits.

Other materials that could be used for quantum-analogue computing include piezoelectric materials and materials with magneto-elastic effects among other materials whose elastic properties are modified by external stimuli.

Applying Photo-Actuated Multi-Phonon Superpositions of States in Co-Bit Arrays for Realizing Physically, Massively Parallel Processing Capabilities The quantum-analogue computer platform 100 provides a scalable parallel φ-bit array composed of N elastically coupled chalcogenide fibers and is configured to achieve entangled non-separable multi-phonon superpositions of states as shown in FIG. 1. The array can consist of a single φ-bit fiber, a pair of φ-bits, and the capstone of a parallel register array of a finite number, N, of φ-bits. Each φ-bit can be a single chalcogenide glass fiber supporting piezoelectric-transducers at its ends in order to produce and detect guided longitudinal elastic waves. Each φ-bit can be addressable by conventional electrical signals with controlled frequency and direction of propagation. The elastic pseudospin state of each individual chalcogenide fiber can be set by manipulating the spatial and temporal elastic DOF using the photo-elastic and/or photo-expansion effects. Each fiber can be illuminated with near-bandgap laser radiation at a deliberate power non-uniformity to create graded density and elastic coefficients. Multiple elastically coupled φ-bit fibers embedded in a transparent elastic matrix (not shown in FIG. 1) can lead to a non-separable, multi-phonon superposition of states in the exponentially complex (2N) Hilbert space of the parallel φ-bit array.

New Paradigm in Quantum Computing

Qubit-based computing platforms can capitalize on the phenomenon of exponentially complex superpositions of states, which allows a quantum-analogue computer 100 to perform simultaneous calculations beyond that which is achievable with serially interconnected conventional transistor-based processors. Quantum systems possess non-separable exponential complexity by the very nature of the quantum world, and as mentioned previously, achieving the long sought after promise of quantum computing requires qubits to be: (1) stable at room temperature with respect to state decoherence for appreciable times; and (2) numerous on the scale of exponential complexity. Conventional qubits are a paradigm shift away from delivering on this promise. For example, current φ-bit platforms use nuclear/electron spin, trapped ions, superconducting states, or photon polarization, all of which easily lose their state in a noisy environment or in large arrays by decoherence. However, the multiple φ-bit parallel arrays of the present disclosure satisfy both of these requirements. The elastic waves can be supported by graded φ-bits that are stable over time periods exceeding many seconds. Elastic pseudospin superpositions of states are not subject to quantum wave function collapse. In addition, elastic waves supported by interacting φ-bits have the ability to couple into non-separable exponentially complex superpositions. Hence, the presently disclosed φ-bits offer a new impactful paradigm for quantum information processing to finally achieve a controllable, decoherence-free, massively parallel, all-phonon quantum-analogue computing platform. For example, an array of N=50 φ-bits has a parallel computing capacity of $2^{50} \sim 1 \times 10^{15}$ bits. In contrast to existing qubit technologies, the chalcogenide materials of the presently disclosed φ-bits are compatible with integrated electronic and photonic manufacturing processes, as well as with established information processing technologies. As a result, chalcogenides present an additional advantage in the future adoption of the quantum-analogue computer 100.

Single φ-Bit Chalcogenide Glass Fiber

The basis for fabricating a single φ-bit is an elastic waveguide comprising a chalcogenide glass such as Ge—As—Se. The stiffness and mass density of the glass are graded along the length of a segment of the fiber by exploiting the known photo-elastic and photo-expansion effects of chalcogenide materials. The wave equation for longitudinal elastic displacement, ũ, along a one-dimensional waveguide with graded mass density ρ(x), and stiffness, E(x) is given by Equation (1) below:

$$\rho(x)\frac{\partial^2 \tilde{u}}{\partial t^2} - \frac{\partial}{\partial x}\left(E(x)\frac{\partial \tilde{u}}{\partial x}\right) = 0 \qquad \text{Eq. (1)}$$

When the graded density and stiffness obey the same functional form (as the result of experiencing the same external stimulation): $\rho(x)=\rho_0 S(x)$ and $E(x)=E_0 S(x)$, then Equation (1) takes on the form of Webster equation:

$$\frac{\partial^2 \tilde{u}}{\partial t^2} - \beta^2 \left\{\frac{1}{S(x)}\frac{\partial}{\partial x}\left(S(x)\frac{\partial \tilde{u}}{\partial x}\right)\right\} = 0$$

where $$\beta^2 = \frac{E_0}{\rho_0}.$$

Introducing the variable: $u=\tilde{u}S(x)^{1/2}$, Equation (1) further reduces to:

$$\frac{\partial^2 u}{\partial t^2} - \beta^2 \left\{\frac{\partial^2 u}{\partial x^2} - V(x)u\right\} = 0 \qquad \text{Eq. (2)}$$

with $V(x)=(d^2S(x)^{1/2}/dx^2)/S(x)^{1/2}$.

Given the exponentially varying grading $S(x)=e^{ax}$, where a is some geometrical coefficient, the φ-bit wave equation becomes the Klein-Gordon:

$$\frac{\partial^2 u}{\partial t^2} - \beta^2 \frac{\partial^2 u}{\partial x^2} + \alpha^2 u = 0 \qquad \text{Eq. (3)}$$

with the parameter $\alpha^2=a\beta^2$.

It has previously been shown that the modes of a φ-bit can be projected onto propagation directions using a Dirac-like factorization:

$$\left[\sigma_x \frac{\partial}{\partial t} + i\beta\sigma_y \frac{\partial}{\partial x} \pm i\alpha I\right]\psi = 0 \qquad \text{Eq. (4a, b)}$$

where $\sigma_x$ and $\sigma_y$ are the 2x2 Pauli matrices and I is the 2x2 identity matrix. These modes are expressible in terms of spinor amplitudes and orbital components. Furthermore, because of the sign ±, the complete set of states of the φ-bit includes non-dual solutions ('particle' and 'antiparticle'). The solutions are plane waves:

$$\psi_k\psi(k,\omega_k)=c_0\xi_k(k,\omega_k)e^{(\pm i\omega_k t)}e^{(\pm)ikx}$$

and $$\overline{\psi}_k\overline{\psi}(k,\omega_k)=c_0\overline{\xi}_k(k,\omega_k)e^{(\pm i\omega_k t)}e^{(\pm)ikx}$$

where $\xi_k$ and $\overline{\xi}_k$ are 2x1 spinors.

The spinor amplitudes have the form $$\begin{pmatrix} s_1\sqrt{\omega \pm \beta k} \\ s_2\sqrt{\omega \mp \beta k} \end{pmatrix}$$

with $s_1$ and $s_2$ taking on the values +1 or −1 depending on the sign of k and ω. The solutions are quasi-standing waves with the components of the spinor representing the amplitude of the wave in the forward and backward directions of propagation, respectively. Spin-like states can therefore be defined in the direction of propagation of elastic states (forward $$|F\rangle = \begin{pmatrix} 1 \\ 0 \end{pmatrix} \text{ or } |0\rangle;$$

and backward $$|B\rangle = \begin{pmatrix} 0 \\ 1 \end{pmatrix}$$

or $|1\rangle$) and crucially, in the superposition of states: $(s_1 \sqrt{\omega \pm \beta k})|0\rangle + (s_2\sqrt{\omega \pm \beta k})|1\rangle$. The superposition of states is tunable by frequency, $\omega$ and/or wavenumber k. These elastic waves with Dirac spinor characteristics have a half-integer spin analogue, i.e., a pseudospin. A graded elastic waveguide can therefore serve as experimental realization of a $\varphi$-bit that can support a pseudospin.

A $\varphi$-bit can be fabricated in the physical form of a chalcogenide glass graded elastic waveguide fiber, such as Ge—As—Se, which forms covalently bonded networks. Advantageously, covalent bonds in a glass network can be optically broken by photoexcitation of valence electrons using sub-bandgap light, which thereby changes physical properties of the chalcogenide glass fiber, such as photoelasticity and photo-expansion. The changes are large enough and reversible for rewriting graded density and stiffness $\rho(x)=\rho_0 S(x)$ and $E(x)=E_0 S(x)$ along a glass fiber. Quantum-analogue computing is not restricted to the use of fibers. For example, plate modes on surfaces can also be used for quantum-analogue computing as well as in the bulk and other geometric configurations.

Ultra-high purity glass preforms can synthesized in accordance with one or more aspects of the present disclosure. The set-up of fibers shown in FIG. 2 can be fabricated by two different approaches. In the first approach, a 1 mm diameter rod can initially be drawn as needed to support the $\varphi$-bit. The 1 mm rod can then be tapered to a diameter of 300 µm using, for example, a VYTRAN GPX-2400 Optical Glass Fiber Processor, to elongation lengths up to 15 cm. This length permits the propagation of an acoustic signal in the 100 kHz to 1 MHz frequency range with a wavelength of $\lambda$<5 cm suitable to demonstrate a single $\varphi$-bit. The acoustic signal can be generated and detected using AlN (Aluminum Nitride) piezoelectric transducer films sandwiched between two metallic film electrodes deposited on each end of the fiber.

In the second approach, a larger size taper can be produced by using a fiber drawing tower to pull a 10 mm diameter such that it is tapered down to less than 1 mm in diameter. The larger diameter fiber input and output can allow use of commercial piezoelectric transducers to generate and detect acoustic signals. For both approaches, a Ti-sapphire laser can be used, tuned at a wavelength related to the glass bandgap energy of the chalcogenide fiber(s), to induce a reversible photo-elastic and photo-expansion gradient along a fiber.

Experimental Testing and Realization of One $\varphi$-Bit Deutsch-Jozsa Algorithm In some embodiments, AN piezoelectric transducers are connected to each end of each fiber to produce and detect guided longitudinal waves. The AlN piezoelectric transducers can also create the desired spinor superposition of states by controlling the frequency and wavenumber for a fixed grading geometry. In contrast with qubits, the pseudospin superposition of states is simply measurable through the transmission coefficient of a $\varphi$-bit. For instance, the transmission coefficient is zero for an incident wave $e^{ikx} e^{i\omega t}$ at $\omega=\alpha$ (k=0) and the spinor part of the wave function takes on the form:

$$\alpha \begin{pmatrix} 1 \\ 1 \end{pmatrix}.$$

The components of the spinor vary monotonically as the frequency is increased (i.e., the wavenumber k is increased) until it takes a limiting form:

$$\sqrt{2\beta k} \begin{pmatrix} 1 \\ 0 \end{pmatrix}$$

and the transmission coefficient approaches 1.

A similar tuning of the spinor part of the wave function can be achieved by fixing the frequency of the incident waves and varying the geometrical factor $\alpha$ in the grading profile S(x). Launching the incident wave from the opposite side of the $\varphi$-bit corresponds to an incident wave with $\omega<0$. In that case, for instance for $\omega=\alpha$ (k=0), the spinor takes the value $$\alpha \begin{pmatrix} -1 \\ 1 \end{pmatrix}.$$

Therefore, for a given incident wave of frequency $\omega$, the operation of tuning $\alpha$, between zero and $\omega=\alpha$, can be visualized as a Hadamard transformation. As seen previously, the Hadamard transformation can then be physically achieved by varying the grading.

In its matrix representation, the Hadamard transformation is $$\begin{pmatrix} 1 & 1 \\ 1 & -1 \end{pmatrix}$$

and transforms a wave launched from the left $$\begin{pmatrix} 1 \\ 0 \end{pmatrix}$$

into the standing wave that is spinor proportional to $$\begin{pmatrix} 1 \\ 1 \end{pmatrix}.$$

The Hadamard transformation also transforms a wave propagating from the right $$\begin{pmatrix} 0 \\ 1 \end{pmatrix}$$

into the standing wave for which the spinor part is proportional to $$\begin{pmatrix} 1 \\ -1 \end{pmatrix}.$$

The action of applying the Hadamard transformation (also known as the Hadamard gate) for a second time is equivalent to detuning the parameter $\alpha$ from $\omega=\alpha$ to zero. This transforms the superposition of states $$\begin{pmatrix} 1 \\ 1 \end{pmatrix} \text{ and } \begin{pmatrix} 1 \\ -1 \end{pmatrix}$$

back into the traveling states $$\begin{pmatrix} 1 \\ 0 \end{pmatrix} \text{ and } \begin{pmatrix} 0 \\ 1 \end{pmatrix}.$$

This transformation can be detected easily through the change in transmission from 0 to 1. The control of the relative magnitude and sign of the spinor components of the wave function enables information encoding in the phase of the superposition of states.

Furthermore, a φ-bit can also replicate the known quantum computing operations of identity, phase flip, bit flip, and phase-bit flip. A single φ-bit Deutsch-Jozsa algorithm can be performed readily through the transformation described above to determine if a function $f:\{0,1\} \to \{0,1\}$ is balanced or constant by first creating a superposition of state using the Hadamard gate $$|0\rangle + |1\rangle = \begin{pmatrix} 1 \\ 1 \end{pmatrix}.$$

An oracle, $U_f|X\rangle = (-1)^{f(x)}|X\rangle$, transforms this state into $|0\rangle + |1\rangle$ if the function is constant (to within a global phase) or $$|0\rangle - |1\rangle = \begin{pmatrix} 1 \\ -1 \end{pmatrix}$$

if the function is balanced (still to within a global phase).

In the qubit-based algorithm of the present disclosure, the Hadamard gate is subsequently applied to collapse the superposition of state into measurable pure states $|0\rangle$ if the function is constant and $|1\rangle$ balanced. Using a φ-bit, the superposition of state by the transmission coefficient can directly and advantageously be measured.

Serial Two φ-Bit Chalcogenide Fiber with Controllable Bit-to-Bit Coupling and/or Isolation Longitudinal bulk elastic waves can be produced with unidirectional backscattering-immune topological states by applying periodic spatio-temporal modulations to the stiffness of an elastic chalcogenide material. This advance demonstrates the possibility of attaining one-way phonon transport and immunity to scattering; thus enabling decoherence problems to be addressed as well as the measurement problem of conventional multiple qubit quantum systems. For instance, in the serial two φ-bit chalcogenide fiber configuration shown in FIG. 3, it may be desirable to modify the superposition of states of a first φ-bit based on the value of the superposition of states of a second φ-bit without modifying the first φ-bit. This type of operation is encountered in the two qubit Deutsch-Josza algorithm (see below). In order to achieve such a modification, it is necessary to achieve control of the coupling between φ-bits, and in particular, it is necessary to achieve isolation through one-way propagation between serially arranged φ-bits.

Figure 4:
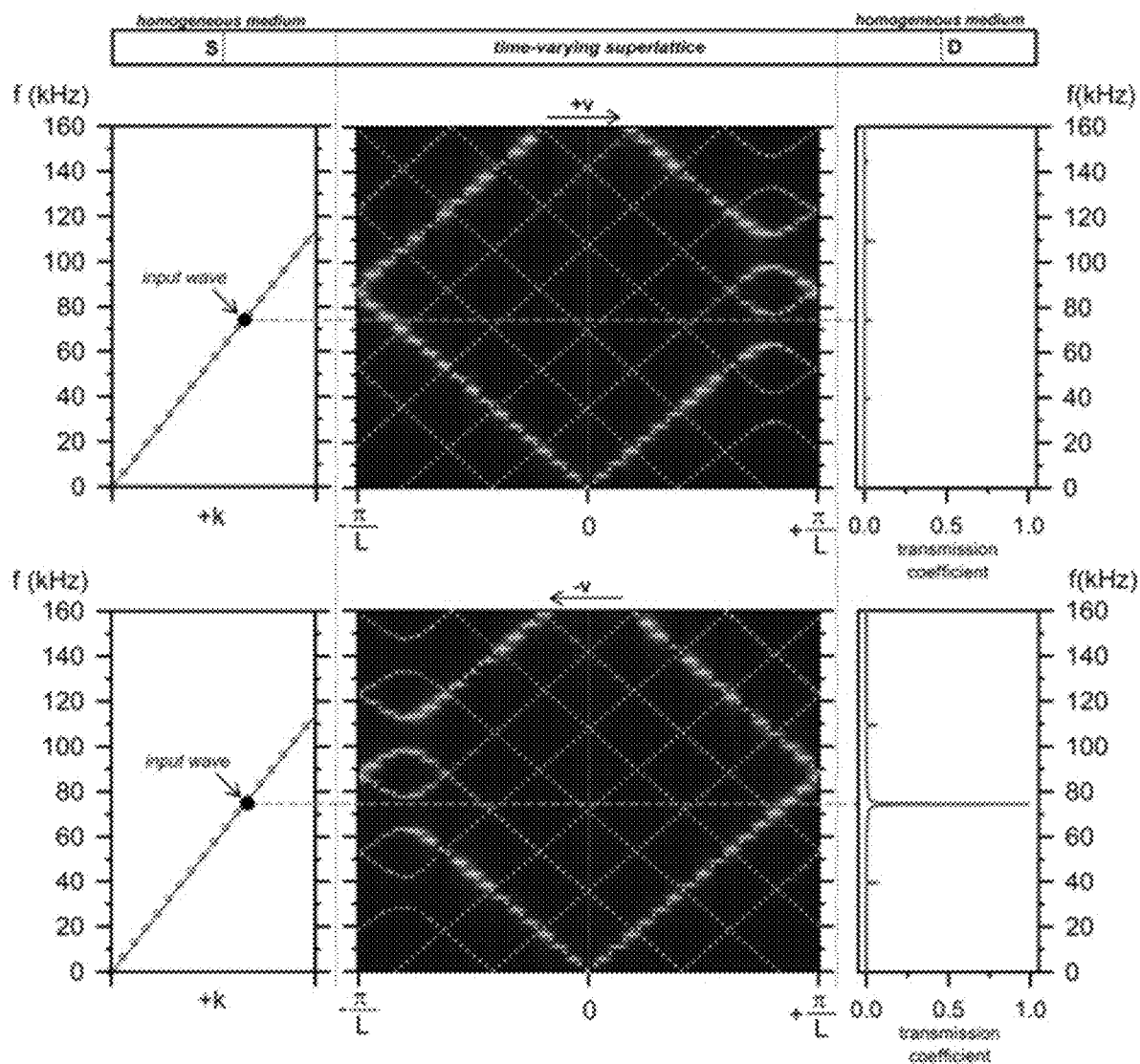
FIG. 4 is a graphical representation showing a numerical simulation of the condition for transmission coefficient of a finite size time-dependent, super-lattice sandwiched between two φ-bits—one serving as source (S) of elastic waves, and another one serving as detector (D) in the case (a) V>0 and (b) V<0, according to one aspect of the present disclosure.
Figure 5:
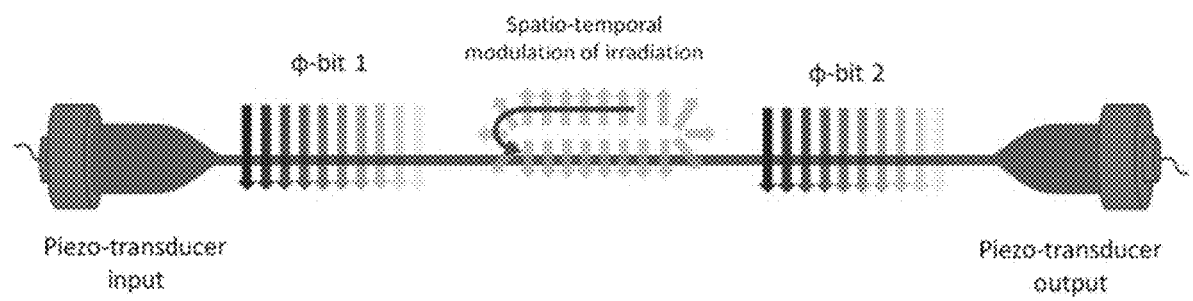
FIG. 5 is a simplified illustration showing an experimental demonstration of a two φ-bit chalcogenide fiber with a spatially and temporally modulated light source, according to one aspect of the present disclosure.

FIG. 4 illustrates achieving one-way propagation of elastic waves between two φ-bits. A sinusoidal spatio-temporal modulation of the stiffness of the chalcogenide material (separating the two φ-bits) will form a time-dependent superlattice that breaks time reversal symmetry for elastic wave propagation. Depending on the velocity and direction of propagation of the modulation, it will achieve non-reciprocal, one-way propagation of the elastic waves. With this approach, an elastic wave exiting φ-bit #1 cannot reflect when reaching φ-bit #2. The pseudo-spin state of φ-bit #2 can therefore be affected by the pseudospin state of φ-bit #1; but not the reverse.

Experimental Development

The magnitude of the changes in stiffness of the proposed chalcogenide glasses are sufficient to perform spatio-temporal modulation of elastic properties between φ-bits, and to test in the laboratory the proposed non-reciprocity in the propagation of elastic waves. The photo-induced changes in stiffness are generated by the photoexcitation of a fraction of covalent bonds within the chalcogenide glass/fiber. Pump-probe measurements have shown that the photoexcitation process is as fast as a few nanoseconds, while the subsequent relaxation process is complete within a few microseconds. These times are fast enough to achieve the needed spatio-temporal modulations. The experimental approach for a serial two φ-bits fiber is described in FIG. 5 and adds a spatially and temporally modulated light source to the single φ-bit set-up.

The presently disclosed approach for achieving a spatio-temporal modulation of a photosensitive chalcogenide material is based on modulated optical interference patterns. Just as for a conventional interferometer, a change in phase of one interference arm results in a translation of the interference pattern. Alternatively, a set up with a rotating multi-faceted mirror can be employed.

Testing and Evaluation

The ability to operate on a first φ-bit based on the state of a second φ-bit was experimentally tested. For a given incident longitudinal elastic wave, the first φ-bit was prepared in the state $|0\rangle+|1\rangle$ by writing the grading profile S(x). The second φ-bit was prepared in the state $|0\rangle-|1\rangle$ by writing the grading profile S(-x). The two φ-bit fiber is in the tensor product state $(|0\rangle+|1\rangle) \otimes (|0\rangle-|1\rangle)$. The ability to modify the state of the second φ-bit without modifying the state of the first φ-bit was tested successfully, wherein the state of the second φ-bit was modified while the state of the first φ-bit remained unchanged. The spatio-temporal modulation that leads to one-way propagation prevents the elastic waves transmitted through the first φ-bit from reflecting off of the second φ-bit. In particular, this capability will is demonstrated—in the case of balanced or constant functions, $f$—by the ability to implement the operation $|X\rangle \otimes |Y\rangle \otimes |f(X) \oplus Y\rangle$. This operation modifies the second φ-bit based on the state of the first φ-bit, while retaining the state of the first φ-bit. Operating on the second φ-bit can be achieved physically: by tuning the spinor part of the wave function; by varying the frequency of the incident wave; or varying the geometrical factor α in grading profile S(x).

Achieving Non-Separable Multi Pseudospin Superposition of States in Coupled Co-Bit Arrays According to various aspects of the present disclosure, it is possible to realize non-separable pseudospin states by physically coupling φ-bits elastically. For the case of N coupled φ-bits, there are two possible Dirac equations:

$$\left\{ U_{N \times N} \otimes \sigma_x \frac{\partial}{\partial t} + \beta U_{N \times N} \otimes (-i\sigma_y) \frac{\partial}{\partial x} \pm i\alpha U_{2N \times 2N} \sqrt{M_{N \times N}} \otimes \sigma_x \right\} \Psi_{2N \times 1} = 0 \quad \text{Eq. (5)}$$

Now specifying to two coupled φ-bits, the coupling matrix, $M_{N \times N}$, takes the form:

$$M_{2 \times 2} = \begin{pmatrix} 2 & -1 \\ -1 & 2 \end{pmatrix}.$$

The eigen values and real eigen vectors of this coupling matrix are:

$$\lambda_0^2 = 1, \lambda_1^2 = 3 \text{ and} \quad \text{Eq. (6)}$$
$$e_0 = \begin{pmatrix} A_1 \\ A_2 \end{pmatrix} = \frac{1}{\sqrt{2}} \begin{pmatrix} 1 \\ 1 \end{pmatrix},$$
$$e_1 = \begin{pmatrix} A_1 \\ A_2 \end{pmatrix} = \frac{1}{\sqrt{2}} \begin{pmatrix} 1 \\ -1 \end{pmatrix}$$

Based on the above, a tensor product state in the $2^2$ exponential space is constructed:

$$\Phi_{2^2 \times 1} = \{(\chi_n)^2 A_1 A_2 e^{i2kx} s_{2 \times 1} \otimes s_{2 \times 1} + \chi_n \chi_n,$$
$$A_1 A'_2 e^{ikx} e^{ik'x} s_{2 \times 1} \otimes s'_{2 \times 1} + \chi'_n \chi_n A'_1 A_2 e^{ik'x} e^{ikx} s'_{2 \times 1} \otimes s_{2 \times 1} +$$
$$(X'_n)^2 A'_1 A'_2 e^{i2k'x} s'_{2 \times 1} \otimes s'_{2 \times 1} \} e^{i2\omega_o t} \{\tau_1, \tau_2, \tau_3, \tau_4\}$$

Accordingly, there exists a basis $\{\tilde{\tau}_1, \tilde{\tau}_2, \tilde{\tau}_3, \tilde{\tau}_4\}$ where the system is non-separable. These non-separable pseudospin states form the foundation for a quantum-like exponential complexity and are therefore the foundations of massively parallel computing capability. In the case of N coupled φ-bits, the elastic states span the N tensor product space $H \otimes H \otimes \ldots \otimes H$, where H is a single φ-bit Hilbert space. The non-separable elastic pseudospin states are represented by spinors with $2^N$ components.

Experimental Realization

Figure 6:
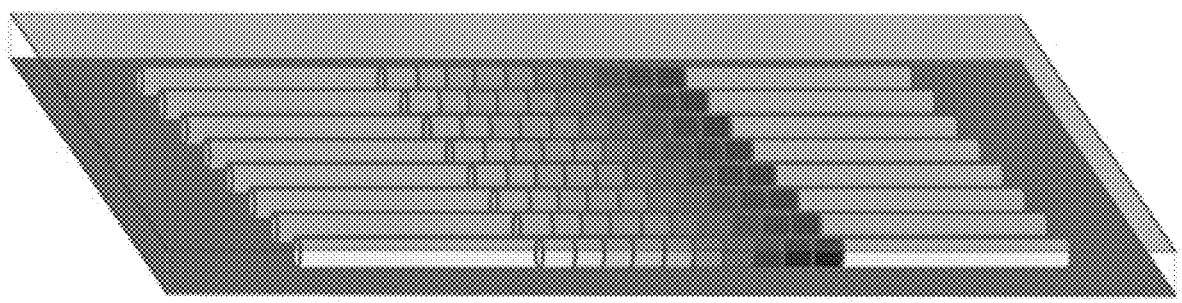
FIG. 6 is an illustration showing non-separable multi pseudospin superposition of states in parallel φ-bit array; according to one aspect of the present disclosure.

In order to provide experimental evidence for a non-separable multi pseudospin superposition of states in parallel φ-bit array, a series of $N \in [2,50]$ parallel chalcogenide glass fibers were be embedded in a matrix of epoxy or another matrix as illustrated in FIG. 6. The epoxy polymer is an ideal choice because it affords easy fabrication of the composite system; but also has a lower elastic constant than the glass that will enable guiding of the elastic wave within a fiber while allowing coupling via the evanescent wave with neighboring fibers to achieve non-separable pseudospin states. Moreover, the epoxy resin is transparent to visible-near-IR light and therefore permits access for optically modulating the fibers. The acoustic signal will be generated and collected using AlN transducers. The sides of the matrix/fiber composite block will be polished so that the fiber ends are flushed and enable contact with the transducers.

Other Experimental Platforms

Prior work on photo-structural changes in chalcogenide glasses indicates that large photo-induced changes in elastics constants (up to 50%) and volume are achievable at a fast rate. Nevertheless, in the event that the magnitude and/or speed of these changes are not satisfactory, it is proposed that a substitute material system which offers an alternate route for experimentally demonstrating the proposed φ-bit systems. This route will be based on Ge—Sb—Te phase change materials (PCMs) that are well known for their applications in optical memories (RW-DVD). This technology is based on the laser-induced phase change between a highly reflective crystalline phase and a poorly reflective amorphous phase to constitute '0' and '1' memory bits. Most interestingly for the system and method of the present disclosure, the phase change is also accompanied by a large change in elastic constant and density. Moreover the transition speed is extremely fast, at <10 nanoseconds. If needed, these properties can be exploited to create permanent and modulated gradients in density and elastic constant by tuning discrete amorphous and crystalline domains along a slab of PCM material.

Figure 7:
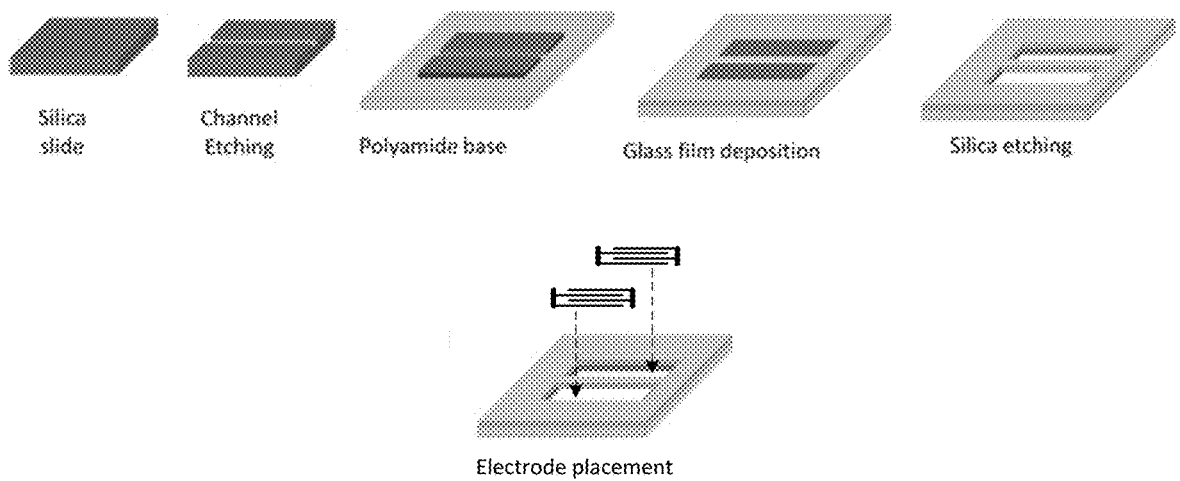
FIG. 7 is an illustration showing the multi-step fabrication process for the production of suspended PCM slabs, according to one aspect of the present disclosure.

Unfortunately, PCMs do not afford the possibility of fiber drawing, hence the backup is to develop a different configuration based on suspended thin film slabs as illustrated in FIG. 7. Elastic slabs possess symmetric and antisymmetric slab modes. The elastic wave equation for the antisymmetric slab modes can be Dirac-factored and the antisymmetric slab mode has the Fermion-like characteristics that are necessary to design a φ-bit, although more complex than those described previously for one-dimensional elastic fibers. The slabs can be produced through a succession of thermal deposition and etching. For this slab configuration, the acoustic signal is generated and collected with interdigitated transducers commonly used in phononic filter technology. A set of interdigitated transducers composed of a piezoelectric AlN film sandwiched between two Al electrodes could be deposited on both sides of the slab. This method has been successfully used to test passive phononic crystal filters at high frequency. It is expected that this approach will generate permanent gradients in material properties (equivalent to permanent DVD memories) as well as the reversible and modulated property changes (equivalent to DVD rewriting), both of which are needed to achieve the proposed φ-bit technology.

CONCLUSION

The states of the coupled two-chain system, like any elastic system, can be readily decomposed in the spectral representation. The states of the coupled system spans the tensor product space of the energy spectrum associated with wave vector k. However, it is also possible to express the states of the coupled system in the tensor product space of two subsystems, namely two non-interacting systems composed of a single chain coupled to a rigid substrate. While some of the states of the bipartite system can be written as tensor products of states of the subsystems, there exists a very large number of states for a realizable physical system, infinite in the abstract, that display correlations that do not allow such decomposition.

These states exist in the tensor product Hilbert space of two single chain systems but are not expressible by a simple tensor product. The spectral decomposition describes the orbital part of the wave function. It has been found that new correlations in the directional representation that may lead to non-separability in the spinor part of the amplitude, i.e., correlations between the directions of propagation. The degrees of freedom associated with direction of propagation lead to non-separability. The choice of the decomposition into the tensor product Hilbert space of two single chain systems is motivated by the possibility of measuring directly these degrees of freedom through measurement of transmission coefficients. This concept can be extended to three coupled chains, whereby the spinor state of a three mutually coupled chain system is defined in the $2^3$-dimensional tensor product Hilbert space of the three single chain systems. Most states of the three chain system are not separable and measurements of these states can still be achieved via measurement of transmission coefficient along the three chains. Finally, extension to N mutually coupled chains allows for the possibility of measurable non-separable spinor states in a $2^N$-dimensional space. Such states allow the possibility of storing, processing, and efficiently measuring information in elastic systems with exponential complexity.

It should be understood from the foregoing that, while particular embodiments have been illustrated and described, various modifications can be made thereto without departing from the spirit and scope of the invention as will be apparent to those skilled in the art. Such changes and modifications are within the scope and teachings of this invention as defined in the claims appended hereto.

What is claimed is:

1. A quantum-analogue computing bit array comprising:
   an elastic media having an externally tunable photo-elastic effect and an externally tunable photo-expansion effect that allow a manipulation of one or more of structural degrees of freedom within the elastic media;
   at least one analogue qubit defined by one or more elastic waves propagating within the elastic media according to a first chosen grading profile written to the elastic media;
   a modulated light source oriented to illuminate the elastic media with a laser radiation calculated to write the first chosen grading profile to the elastic media in order to achieve a non-separable multi-phonon superposition of states within the elastic media, the non-separable multi-phonon superposition of states determined based at least in part on forward propagating and backward propagating components of the one or more elastic waves, wherein the modulated light source writes the first chosen grading profile to the elastic media by:
      manipulating the externally tunable photo-elastic effect of the elastic media to generate a series of graded elastic coefficients varying along a length of the elastic media; and
      manipulating the externally tunable photo-expansion effect of the elastic media to generate a series of graded density coefficients varying along the length of the elastic media; and
   one or more piezoelectric transducers disposed at distal ends of the elastic media such that the non-separable multi-phonon superposition of states can be measured in a single measurement using the one or more piezoelectric transducers.

2. The quantum-analogue computing bit array of claim 1, further comprising:
   a first piezoelectric transducer at a first distal end of the elastic media; and
   a second piezoelectric transducer at a second distal end of the elastic media;
   wherein the first and second piezoelectric transducers are configured to produce and detect guided longitudinal elastic waves within the elastic media.

3. The quantum-analogue computing bit array of claim 1, comprising:
   three or more analogue qubits defined by a corresponding three or more elastic media, wherein the three or more elastic media are embedded in a matrix material such that the evanescent waves of adjacent ones of the three or more elastic media are coupled to achieve an entangled non-separable multi-phonon superposition of states.

4. The quantum-analogue computing bit array of claim 3, wherein:
   the matrix material comprises an epoxy polymer or resin that has a lower elastic constant than the three or more elastic media and is substantially transparent to the laser radiation; and
   the three or more elastic media are embedded in the matrix material in a parallel configuration.

5. The quantum-analogue computing bit array of claim 3, further comprising one or more piezoelectric transducers at distal ends of one or more of the three or more elastic media, such that the entangled non-separable multi-phonon superposition of states can be measured in a single measurement using the one or more piezoelectric transducers.

6. The quantum-analogue computer platform of claim 1, wherein the elastic media comprises a chalcogenide material.

7. The quantum-analogue computing bit array of claim 3, wherein the three or more elastic media comprise three elastically coupled Ge—As—Se chalcogenide fibers.

8. The quantum-analogue computing bit array of claim 1, wherein the elastic media comprises a piezoelectric material or a magneto-elastic material.

9. The quantum-analogue computing bit array of claim 1, wherein the elastic media comprises:
   a suspended thin film slab;
   disposed on a first face of the thin film slab, a first interdigitated transducer composed of a piezoelectric AlN film and a first Al electrode; and
   disposed on a second face of the thin film slab, a second interdigitated transducer composed of a piezoelectric AlN film and a second Al electrode.

10. The quantum-analogue computing bit array of claim 9, wherein:
   the suspended thin film slab possesses symmetric and antisymmetric slab modes that exhibit Fermion-like characteristics and can be Dirac-factored; and
   the symmetric and antisymmetric slab modes are adjusted in order to achieve the non-separable multi-phonon superposition of states within the suspended thin film slab.

11. The quantum-analogue computing bit array of claim 1, wherein:
- the elastic media further allows a manipulation of one or more temporal degrees of freedom within the elastic media; and
- the modulated light source illuminates the elastic media with the laser radiation in order to apply a grading function to the elastic media.

12. The quantum-analogue computing bit array of claim 11, wherein the grading function:
- comprises one or more modulated optical interference patterns of the laser radiation illuminating the elastic media; and
- adjusts the photo-elastic and photo-expansion effects of the elastic media in order to manipulate the one or more structural degrees of freedom and the one or more temporal degrees of freedom of the elastic media.

13. The quantum-analogue computing bit array of claim 1, wherein the modulated light source is a Ti-sapphire laser tuned at a wavelength related to the bandgap energy of the elastic media.

14. The quantum-analogue computing bit array of claim 1, wherein the modulated light source consists of at least one laser and one or more rotating multi-faceted mirrors disposed between the at least one laser and the elastic media.

15. The quantum-analogue computing bit array of claim 2, wherein one or more of the first piezoelectric transducer and the second piezoelectric transducer comprise an AlN piezoelectric transducer film disposed between two metallic film electrodes.

* * * * *